United States Patent
Nistler et al.

(10) Patent No.: US 10,345,401 B2
(45) Date of Patent: Jul. 9, 2019

(54) APPARATUS AND METHOD FOR DETECTING ANTENNA COILS

(71) Applicant: Siemens Healthcare GmbH, Erlangen (DE)

(72) Inventors: Jürgen Nistler, Erlangen (DE); Markus Vester, Nürnberg (DE); Christian Wünsch, Röthenbach a.d.Pegnitz (DE)

(73) Assignee: SIEMENS HEALTHCARE GMBH, Erlangen (DE)

(*) Notice: Subject to any disclaimer, the term of this patent is extended or adjusted under 35 U.S.C. 154(b) by 0 days.

(21) Appl. No.: 15/977,207

(22) Filed: May 11, 2018

(65) Prior Publication Data
US 2018/0329003 A1 Nov. 15, 2018

(30) Foreign Application Priority Data
May 11, 2017 (EP) .................................. 17170596

(51) Int. Cl.
*G01R 33/28* (2006.01)
*G01R 33/36* (2006.01)

(52) U.S. Cl.
CPC ....... *G01R 33/288* (2013.01); *G01R 33/3657* (2013.01); *G01R 33/3628* (2013.01)

(58) Field of Classification Search
CPC .............. G01R 33/288; G01R 33/3628; G01R 33/3657
See application file for complete search history.

(56) References Cited

U.S. PATENT DOCUMENTS

| 8,111,070 B2 * | 2/2012 | Adachi ............... G01R 33/583 324/307 |
| 8,816,688 B2 * | 8/2014 | Adachi ............... G01R 33/583 324/318 |
| 2008/0157765 A1 | 7/2008 | Fontius et al. |

(Continued)

FOREIGN PATENT DOCUMENTS

| DE | 102006061740 A1 | 7/2008 |
| DE | 102015217723 A1 | 3/2017 |

(Continued)

OTHER PUBLICATIONS

European Office Action for corresponding Application No. 17170596.5-1210, dated May 31, 2018.

(Continued)

*Primary Examiner* — Dixomara Vargas
(74) *Attorney, Agent, or Firm* — Lempia Summerfield Katz LLC

(57) ABSTRACT

An apparatus and a method for detecting an antenna coil with a non-active detuning apparatus are provided. The apparatus has a transmitter, an antenna, an amplitude meter, and a controller. The controller actuates the transmitter such that the transmitter emits radio-frequency signals with different predetermined amplitudes via the antenna. The controller acquires testing amplitudes with the amplitude meter as a function of the emitted signal and determines a testing relationship between the predetermined amplitudes and the acquired testing amplitudes. If the determined testing relationship deviates from a predetermined reference relationship, a signal is output.

19 Claims, 2 Drawing Sheets

(56) References Cited

U.S. PATENT DOCUMENTS

| | | | |
|---|---|---|---|
| 2008/0182524 A1 | 7/2008 | Graesslin et al. | |
| 2009/0322330 A1* | 12/2009 | Adachi | G01R 33/5659 |
| | | | 324/309 |
| 2010/0244840 A1 | 9/2010 | McKinnon | |
| 2011/0298459 A1* | 12/2011 | Adachi | G01R 33/5659 |
| | | | 324/318 |
| 2014/0307764 A1 | 10/2014 | Adolf et al. | |
| 2016/0097829 A1 | 4/2016 | Reykowski et al. | |
| 2017/0074953 A1 | 3/2017 | Demharter et al. | |

FOREIGN PATENT DOCUMENTS

| | | |
|---|---|---|
| JP | 2008284270 A | 11/2008 |
| JP | 2009501553 A | 1/2009 |
| KR | 20140123449 A | 10/2014 |
| WO | 2015091544 A2 | 6/2015 |

OTHER PUBLICATIONS

Korean Office Action for Korean Application No. 10-2018-0052447, dated Jun. 29, 2018, with English translation.
European Search Report for European Patent Application No. 171705965-1914, dated Oct. 20, 2017.

\* cited by examiner

APPARATUS AND METHOD FOR DETECTING ANTENNA COILS

This application claims the benefit of EP 17170596.5, filed on May 11, 2017, which is hereby incorporated by reference in its entirety.

BACKGROUND

The present embodiments relate to an apparatus and also to a method for detecting an antenna coil with a non-active detuning apparatus and also a magnetic resonance tomography system having an apparatus of this kind.

Magnetic resonance tomography systems are imaging apparatuses that, in order to map an examination object, align the nuclear spins of the examination object with a strong external magnetic field and, by a magnetic alternating field, excite the nuclear spins for precession about this alignment. The precession or return of the spins from this excited state into a state with less energy in turn generates, as a response, a magnetic alternating field that is received via antennas.

With the aid of magnetic gradient fields, a spatial encoding is impressed onto the signals, which then permits an assignment of the received signal to a volume element. The received signal is then evaluated, and a three-dimensional imaging representation of the examination object is provided. In order to receive the signal, local antennas (e.g., as local coils) that are arranged directly on the examination object may be used to attain an improved signal-to-noise ratio.

For the receiving, the local coils are set to be resonant at the Larmor frequency (e.g., the Larmor frequency of a hydrogen nucleus in the static magnetic field B0 of the magnetic resonance tomography system). During the excitation pulse for the nuclear spins at the same frequency, however, the local coils are to be detuned in order to avoid a destruction due to high induced voltages or currents. The detuning is effected by active components such as PIN diodes that are made conductive by a control current. If the local coil is not connected, passive protection elements such as crossed diodes or safety fuses are provided. If these protection mechanisms are defective, however, then the resonant conditions of the local coil in the surroundings thereof may lead to excessive field strengths during the excitation pulse, which may possibly endanger a person to be examined despite global limit values generally being observed. This may be the case if there is a particular hazardous situation (e.g., due to implants), and exceeding field strength limit values even for a brief period of time endangers the patient.

A local transmit coil with a monitoring facility is known from the publication DE 10 2015 217 723 A1, for example.

SUMMARY AND DESCRIPTION

The scope of the present invention is defined solely by the appended claims and is not affected to any degree by the statements within this summary.

The present embodiments may obviate one or more of the drawbacks or limitations in the related art. For example, examinations by a magnetic resonance tomography system for, for example, patients with implants are made more safe.

The apparatus for detecting an antenna coil with a non-active detuning apparatus has a transmitter, an antenna, an amplitude meter, and a controller. In one embodiment, the transmitter is configured to emit radio frequency at the frequency of a Larmor frequency at which the antenna coil is configured to receive a magnetic resonance signal. The antenna coil may, for example, be a local coil or a body coil or even an element thereof.

The controller is configured to actuate the transmitter such that the transmitter emits radio-frequency signals at different predetermined amplitudes via the antenna. These may involve amplitudes that a voltage generates (e.g., in a range between 0.1V and 2V, 0.2V and 1V, or 0.4V and 0.8V) in a resonant antenna coil in an effective range of the antenna. In one embodiment, the induced voltage involves a voltage that lies in a range of non-linearity of a characteristic curve of a protection element such as a diode, Zener diode, or PIN diode, for example.

The controller has a signal connection with an amplitude meter and is configured to use the amplitude meter to acquire testing amplitudes as a function of the emitted signal. The testing amplitudes may involve, for example, amplitudes that are proportional to a magnetic field component of the radio-frequency signals, such as may be acquired by a pick-up coil. An amplitude may also be provided as a function of an electrical field strength, which may be acquired by a dipole, for example. Also similarly possible are amplitudes of voltages and/or currents in supply lines of the antenna. Amplitudes of signals that depend on the current or voltage non-linearly, such as the output with a quadratic function, for example, may also be provided. In one embodiment, other variables, such as a phase, may be acquired by the controller via the amplitude. According to one or more of the present embodiments, "as a function of the emitted signal" may be that the testing amplitudes are derived from an input signal generated by the emitted signal (e.g., by induction, in real time, or virtually in real time by steps typical when receiving in radio-frequency technology, such as amplifying, attenuating, filtering, mixing, or rectifying). In one embodiment, the controller is configured to acquire at least two testing amplitudes as a function of two different, predetermined amplitudes.

In one embodiment, the controller is configured to determine a testing relationship between the predetermined amplitudes and the acquired testing amplitudes. In one embodiment, for example, the controller may form a difference between the values or a quotient from predetermined amplitude and acquired testing amplitude. In one embodiment, the controller processes the values in advance or later on with additional steps (e.g., applies a power function or a logarithm thereto).

The controller is configured to compare the formed testing relationship with a predetermined reference relationship. For example, the controller may check whether the field strength increases linearly with the voltage applied to the antenna. In one embodiment, an antenna coil with a protection diode above a certain field strength may come into a conducting region of the characteristic curve of the protection diode and, as a result of the output absorbed by the antenna coil, there is no longer a linear correlation between voltage at the antenna and the field strength.

The controller is configured, when a corresponding deviation of the particular testing relationship from a predetermined reference relationship is detected, to output a signal.

In one embodiment, the apparatus makes it possible to detect an antenna coil with non-activated detuning before possible damage to the antenna coil occurs or a patient is endangered due to a high radio-frequency output.

The magnetic resonance tomography system of one or more of the present embodiments and the method of one or more of the present embodiments share the advantages of the apparatus.

In one embodiment of the apparatus, the amplitude meter has a directional coupler. The directional coupler may be arranged between the transmitter and the antenna in order to acquire an output reflected by the antenna, which changes, for example, due to an altered impedance of the antenna as a result of a resonator in the examination region. The acquired testing amplitudes in this embodiment have a dependency upon a reflected output.

A directional coupler offers a simple option for acquiring information regarding the examination region in terms of radio-frequency radiation using the unwanted returning radio-frequency energy without recourse to the leading useful transmit power.

In an embodiment of the apparatus, the predetermined reference relationship is a linear relationship. The predetermined relationship may be stored in a memory of the controller (e.g., as a parameter set with coefficients or value tables). A linear relationship may be that the dependency between predetermined amplitude and testing amplitude follows a linear equation of the form y=ax+b or only deviates therefrom by a maximum of 1%, 5%, 10%, or 20% in the context of measurement inaccuracies. This also includes the special case of a linear relationship with a constant value, which is, however, different from the value zero.

Electrical and magnetic fields follow linear principles, provided that there are no non-linear elements such as a detuning due to diodes, for example. By comparing with a linear characteristic curve and deviations therefrom, an assumption of a corresponding safety technology and the proper functioning thereof may advantageously be made.

In one embodiment of the apparatus, the controller is configured to determine the testing relationship as a function of a phase of the testing amplitude acquired by the amplitude meter. Thus, the predetermined amplitude may, for example, be a voltage of a transmitter output stage that is predetermined by a driver signal of the controller. The amplitude meter may then also acquire as the testing amplitude a current between transmitter output stage and antenna. For impedances at the antenna with ohmic behavior, the phase or phase relationship between voltage and current remains constant, while a loading by a complex resistor, such as a resonant oscillating circuit, causes a phase shift. If in this context the complex resistor itself is dependent upon the transmit power in a non-linear manner, such as is the case for a diode in the resonant circuit, for example, then a non-linear relationship also arises for the phase.

A protection apparatus of an antenna coil may be detected via the phase with high sensitivity.

In one embodiment of the apparatus, the controller is configured to determine the testing relationship as a function of an output emitted via the antenna. In one embodiment, the amplitude meter may be configured to acquire current and voltage and to identify the output via the product of voltage and current. In one embodiment, however, an output from one of the two values may be calculated, assuming an essentially constant impedance. This may be provided if the changes to the measured value are low (e.g., less than 5% or 10%). This is possible, for example, if the antenna is essentially adapted to the impedance of the supply line and the testing amplitude is a reflected output that then only arises if the adaptation changes. The output may also be acquired directly (e.g., bolometrically).

The output is a variable that may acquire an output sink in the form of an antenna coil independently of a possibly location-dependent phase position between current and voltage.

In one embodiment of the apparatus, the apparatus (e.g., the controller) is configured to interrupt an emission of radio frequency by the transmitter as a function of the output signal.

The apparatus may interrupt an emission of radio-frequency radiation by the transmitter before damage occurs (e.g., if a non-connected antenna coil is arranged in an examination region).

In one embodiment of the apparatus, the apparatus is configured to emit a plurality of different predetermined modes via the antenna. The antenna may be, for example, an array with a plurality of independent transmit elements that are able to be actuated differently by a transmitter via a distribution matrix. In one embodiment, a plurality of independent transmit modules in a transmitter are provided. A transmit array of this kind may be provided in a body coil with a plurality of transmit elements or in a local coil with a plurality of coil elements. As the different modes have different polarization, individual modes may not excite an antenna coil or may only excite the antenna coil to a minor degree, with a corresponding alignment of the antenna coil. The apparatus is therefore configured, in this embodiment, to acquire a plurality of testing amplitudes by a plurality of amplitude meters, and to determine one or more testing relationships as a function of the acquired testing amplitudes. A plurality of amplitude meters may also be an individual amplitude meter having a multiplexer with a multiplicity of inputs for the inputs to be acquired.

In one embodiment, the apparatus is also capable of acquiring testing amplitudes for different modes and thus also of detecting antenna coils in different orientations with respect to the antenna.

In one embodiment of the magnetic resonance tomography system, the transmitter is configured to generate an excitation pulse for nuclear spins. For example, the transmitter has the necessary transmit power of more than one kilowatt, for example, in order to excite nuclear spins to a sufficient degree.

As a result, the apparatus is capable of detecting non-connected antenna coils (e.g., in the form of local coils) by the available infrastructure of the magnetic resonance tomography system consisting of transmitter and antenna (e.g., the body coil).

In one embodiment of the method, the method has the step of deactivating a detuning apparatus of an antenna coil. For example, the controller may interrupt a power supply to a PIN diode or another switching element in the antenna coil, so that same no longer short-circuits the resonant circuit. In this case, the antenna coil is located in a region that has a relevant field strength of the radio-frequency signals when the transmitter is activated. A relevant field strength may be a field strength of the radio-frequency field that in the undamped resonant circuit of the antenna coil generates a voltage of more than 0.5 V or 1 V.

With the apparatus of one or more of the present embodiments, in the method, not only may non-connected antenna coils be detected, but the functioning of a detuning facility in a connected antenna coil may also be checked. This applies, for example, for passive additional protection facilities such as fuses or crossed diodes, which are operative without external actuation.

DETAILED DESCRIPTION

Figure 1:
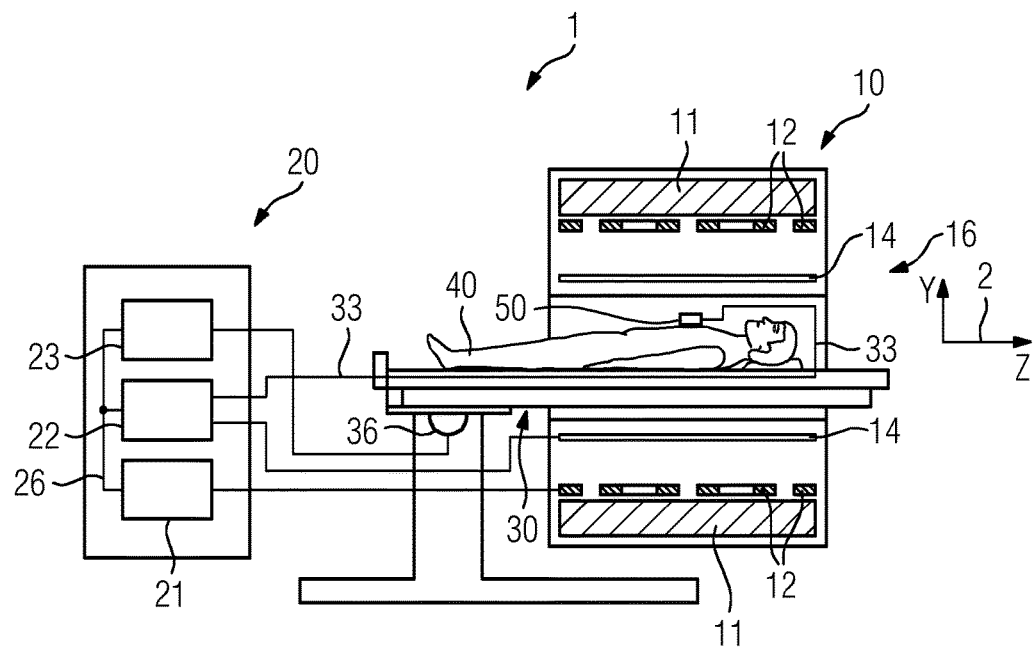
FIG. 1 shows a schematic representation of one embodiment of a magnetic resonance tomography system with an exemplary apparatus.

FIG. 1 shows a schematic representation of an embodiment of a magnetic resonance tomography system 1.

A magnet unit 10 has a field magnet 11 that generates a static magnetic field B0 for aligning nuclear spins of samples or patients 40 in a capture region. The capture region is arranged in a patient tunnel 16 that extends in a longitudinal direction 2 through the magnet unit 10. Normally the field magnet 11 involves a superconducting magnet that may provide magnetic fields having a magnetic flux density of up to 3 T, or even higher in the latest devices. For lower field strengths, however, permanent magnets or electromagnets with normal-conducting coils may also be used.

The magnet unit 10 also has gradient coils 12 that are configured to overlay the magnetic field B0 with variable magnetic fields in three spatial directions for the spatial differentiation of the acquired imaging regions in the examination volume. The gradient coils 12 are normally coils made of normal-conducting wires that may generate fields orthogonal to one another in the examination volume.

The magnet unit 10 likewise has a body coil 14 that is configured to release a radio-frequency signal fed via a signal line into the examination volume and to receive resonance signals emitted by the patient 40 and output the received resonance signals via the signal line. The body coil 14 may, however, be replaced by local coils 50 for the receiving of the radio-frequency signal. The local coils are arranged in the patient tunnel 16 close to the patient 40. In one embodiment, the local coil 50 may be configured to transmit and receive.

A control unit 20 supplies the magnet unit 10 with the various signals for the gradient coils 12 and the body coil 14 and evaluates the signals received.

Thus the control unit 20 has a gradient control 21 that is configured to provide the gradient coils 12 with variable currents via supply lines. The variable currents provide the desired gradient fields in the examination volume on a temporally coordinated basis.

The control unit 20 has a radio-frequency unit 22 configured to generate a radio-frequency pulse with a predetermined time characteristic, amplitude, and spectral power distribution to excite a magnetic resonance of the nuclear spins in the patient 40. In this case, pulse powers in the kilowatt range may be achieved.

Figure 2:
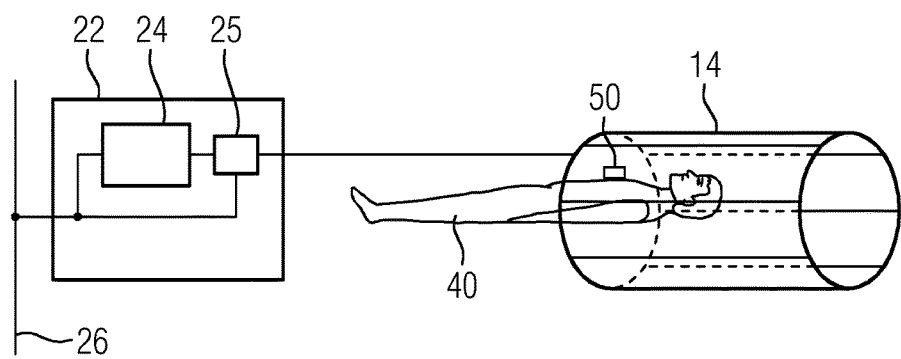
FIG. 2 shows a schematic representation of a possible embodiment of an apparatus.

FIG. 2 shows an exemplary embodiment of one embodiment of the apparatus. In FIG. 2, the same objects are referred to with the same reference characters as in FIG. 1. For reasons of clarity, not all objects from FIG. 1 are shown in FIG. 2.

In the radio-frequency unit 22, a transmitter 24 is provided for generating excitation pulses with the Larmor frequency of the magnetic resonance tomography system. In one embodiment, this involves the Larmor frequency of hydrogen nuclei in the magnetic field B0 of the field magnet 11, but nuclei of other elements are also conceivable. The transmitter 24 is controlled by the controller 23 of the magnetic resonance tomography system 1 via the signal bus 26, so that the transmitter 24 may generate excitation pulses with predetermined frequency, phase, spectral distribution, and/or output. The excitation pulses are transferred via a signal connection to the body coil 14 in the form of an antenna. In this case, the controller 23 and the transmitter 24 are configured to set the output in a range that may extend from a few watts to several kilowatts. For example, the output of the transmitter 24 may be reduced to the extent that the patient and also a non-connected antenna coil (e.g., the local coil 50) are not endangered or destroyed, respectively.

Arranged between the transmitter 24 and the body coil 14 is an amplitude meter 25 that may acquire a measured value of the output signal of the transmitter 24. This is the voltage and/or current, for example. In one embodiment, the amplitude meter 25 may acquire an output by the current and voltage being acquired and multiplied, without the output being directly acquired by its effect (e.g., bolometrically).

Figure 3:
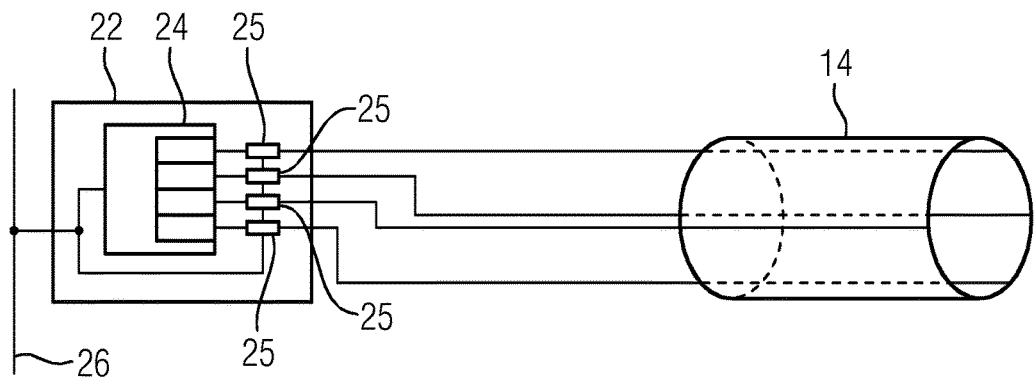
FIG. 3 shows a schematic representation of a possible embodiment of an apparatus.

In FIG. 3, a variant of the apparatus, in which the transmitter 24 has a plurality of transmit modules that may generate radio-frequency signals independently of one another, so that a body coil 14 with independent radiator elements, for example, may be used to embody different modes with different spatial distribution and polarization is shown. In this way, the different modes make it possible to also excite a local coil 50, the coil winding of which may be aligned orthogonally to a first mode and therefore may not be excited with the mode. A plurality of amplitude meters 25 each acquire a testing amplitude of a transmit module. In one embodiment, however, only one amplitude meter 25 that is supplied with the testing amplitudes of different transmit modules via a multiplexer may be provided.

The amplitude meter 25, for example, may also have directional couplers that enable the acquisition of an output reflected by the antenna.

Figure 4:
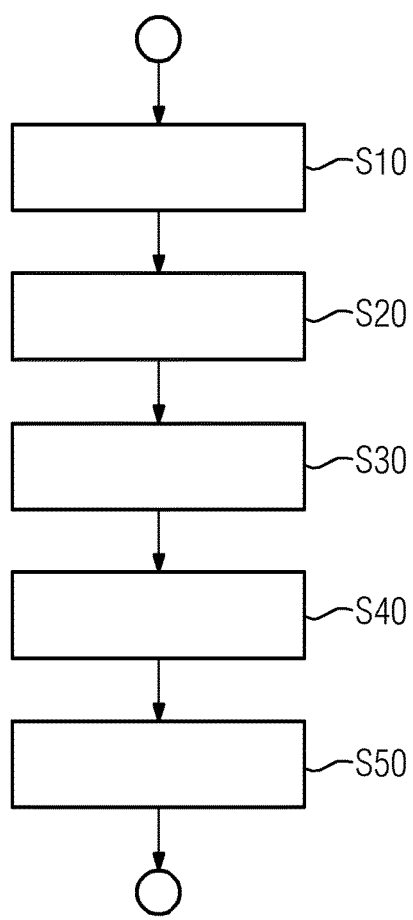
FIG. 4 shows a schematic flow diagram for an exemplary method.

In FIG. 4, a schematic flow diagram of a possible embodiment of the method is shown.

In act S20, the controller 23 gives the transmitter 24, via the signal bus 26, the command to emit radio-frequency signals with different predetermined amplitude via the antenna (e.g., the body coil 14). The amplitudes are chosen such that an endangerment of the antenna coils (e.g., the local coil 50) and, for example, the patient is excluded. For example, the output is less than 5, 10, or 100 watts, so that a voltage induced in a resonant, undamped antenna coil is less than 1 V, 2 V, or 5 V.

In act S30, the amplitude meter 25 acquires testing amplitudes as a function of the emitted signal. In the embodiment in FIG. 3, this may be a voltage at the signal line leading to the antenna, for example. In one embodiment, however, voltage and current or, by directional couplers, an output reflected by the antenna and/or flowing to the antenna may be acquired by the amplitude meter. The amplitude meter may also further acquire signals processed by digital or analog signal processing, such as rectification or filtering, for example. The signals depend upon the signal emitted by the transmitter 24 and are related to the output or even phase thereof. The acquired signals enable a conclusion to be drawn about radio-frequency properties in the patient tunnel 16 or are influenced thereby.

The acts S20 and S30 may be repeated at different amplitudes. For example, the method may start with a low predetermined amplitude of the signals to be sent and increase the amplitude in steps (e.g., with a constant interval or even exponentially). In this manner, the method may begin with safe, low field strengths. In order subsequently to differentiate between a linear and non-linear increase in the testing signal, at least three repetitions at different predetermined amplitudes are to be provided. A possible measurement at a predetermined amplitude of zero may be dispensed with.

In act S40, the controller 23 may determine a testing relationship between the predetermined amplitudes and the acquired testing amplitudes. In one embodiment, however, a dedicated analog or digital signal processing unit may carry out this step. In the simplest case, the controller 23 may form a quotient in each case from the respective predetermined amplitude and the associated testing amplitude. The quotient then indicates an increase in a linear relationship. Due to Maxwell's laws, the correlations to be expected between the electrical and magnetic variables are primarily linear. Only if non-linear elements such as protection diodes, for example, are coupled to the electromagnetic alternating fields and the induced voltages lie in a non-linear region of the characteristic curves of the elements does the correlation deviate from a linear relationship.

In act S50, for example, the controller 23 emits a signal if the controller 23 ascertains a deviation of the determined testing relationship from a predetermined reference relationship. The reference relationship is, in the simplest case, a linear relationship that reflects the linear correlation to be expected between the predetermined output amplitude and the testing amplitude. It may, however, also be that non-linearities in the amplitude meter 23 are already taken into account in the reference relationship and this therefore follows, for example, a potential or exponential course, at least in sections. This may be induced by the behavior of a rectifier diode in the amplitude meter 25, for example. The signal is only generated if the determined relationship deviates from the expected behavior. In one embodiment, the signal serves to interrupt a further emission of radio-frequency output by the transmitter 24, or at least to reduce the further emission, because in this case, there is the suspicion that a non-detuned antenna coil is located in the patient tunnel.

In a conceivable act S10, in one embodiment of the method, the controller 23 deactivates a detuning facility of an antenna coil (e.g., the local coil 50) by a supply voltage for a PIN diode being interrupted, which in the local coil 50, short-circuits a resonant circuit with a coil winding of the local coil 50. The local coil 50 is then resonantly coupled to the radio frequency radiated by the transmitter 24 via the body coil 14 and extracts power from the radio-frequency field. Passive protection mechanisms, such as crossed diodes, for example, in the local coil 50 prevent too high voltages from arising in the local coil 50 as the power of the radio-frequency field increases due to a corresponding non-linear characteristic curve, but also exponentially increasingly extract power from the radio-frequency field. Thus, in the simplest case, via a non-linear relationship between predetermined amplitude and testing amplitude, this leads to the knowledge that an antenna coil is present and the passive protection mechanism is functioning without issues.

Although the invention has been illustrated and described in detail with the exemplary embodiments, the invention is not restricted by the examples given, and other variations may be derived therefrom by a person skilled in the art without departing from the protective scope of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. An apparatus for detecting an antenna coil with a non-active detuning apparatus, the apparatus comprising:
   a transmitter;
   an antenna;
   a real time amplitude meter; and
   a controller,
   wherein the controller is configured to:
      actuate the transmitter such that the transmitter emits radio-frequency signals with different predetermined amplitudes via the antenna;
      acquire testing amplitudes with the real time amplitude meter as a function of the emitted radio-frequency signals;
      determine a testing relationship between the different predetermined amplitudes and the acquired testing amplitudes; and
      emit a signal when the determined testing relationship deviates from a predetermined reference relationship.

2. The apparatus of claim 1, wherein the real time amplitude meter comprises a directional coupler and is configured to acquire the testing amplitudes as a function of a reflected output.

3. The apparatus of claim 1, wherein the predetermined reference relationship in the controller is a linear relationship.

4. The apparatus of claim 1, wherein the controller is further configured to determine the testing relationship as a function of a phase of a testing amplitude of the testing amplitudes acquired by the real time amplitude meter.

5. The apparatus of claim 1, wherein the controller is configured to determine the testing relationship as a function of an output emitted via the antenna.

6. The apparatus of claim 1, wherein the controller is further configured to interrupt an emission of radio frequency by the transmitter as a function of the output signal.

7. The apparatus of claim 1, wherein the apparatus is configured to:
   emit a plurality of different predetermined modes via the antenna;
   acquire a plurality of testing amplitudes using a plurality of real time amplitude meters; and
   determine one or more testing relationships as a function of the plurality of acquired testing amplitudes.

8. A magnetic resonance tomography system comprising:
   an apparatus for detecting an antenna coil with a non-active detuning apparatus, the apparatus comprising:
      a transmitter;
      an antenna;
      a real time amplitude meter; and
      a controller,
      wherein the controller is configured to:

actuate the transmitter such that the transmitter emits radio-frequency signals with different predetermined amplitudes via the antenna;

acquire testing amplitudes with the real time amplitude meter as a function of the emitted radio-frequency signals;

determine a testing relationship between the different predetermined amplitudes and the acquired testing amplitudes; and emit a signal when the determined testing relationship deviates from a predetermined reference relationship, and wherein the transmitter is configured to generate an excitation pulse for nuclear spins.

9. The magnetic resonance tomography system of claim 8, wherein the predetermined reference relationship in the controller is a linear relationship.

10. The magnetic resonance tomography system of claim 8, wherein the controller is further configured to determine the testing relationship as a function of a phase of a testing amplitude of the testing amplitudes acquired by the real time amplitude meter.

11. The magnetic resonance tomography system of claim 8, wherein the controller is configured to determine the testing relationship as a function of an output emitted via the antenna.

12. The magnetic resonance tomography system of claim 8, wherein the controller is further configured to interrupt an emission of radio frequency by the transmitter as a function of the output signal.

13. The magnetic resonance tomography system of claim 8, wherein the apparatus is configured to:

emit a plurality of different predetermined modes via the antenna;

acquire a plurality of testing amplitudes using a plurality of real time amplitude meters; and determine one or more testing relationships as a function of the plurality of acquired testing amplitudes.

14. A method for detecting an antenna coil with a non-active detuning apparatus, with an apparatus comprising a transmitter, an antenna, a real time amplitude meter, and a controller, the method comprising:

actuating, by the controller, the transmitter, so that the transmitter emits radio-frequency signals with different predetermined amplitude via the antenna;

acquiring testing amplitudes with the real time amplitude meter as a function of the emitted radio-frequency signals;

determining a testing relationship between the predetermined amplitudes and the acquired testing amplitudes;

emitting a signal when the determined testing relationship deviates from a predetermined reference relationship.

15. The method of claim 14, further comprising deactivating the non-active detuning apparatus of the antenna coil, wherein the antenna coil is arranged in a region that, in the actuating, has a relevant field strength of the radio-frequency signals.

16. A computer program product comprising:

a non-transitory computer-readable storage medium that stores instructions executable by a programmable controller to detect an antenna coil with a non-active detuning apparatus, with an apparatus comprising a transmitter, an antenna, a real time amplitude meter, and a controller, the instructions comprising:

actuating, by the controller, the transmitter, so that the transmitter emits radio-frequency signals with different predetermined amplitude via the antenna;

acquiring testing amplitudes with the real time amplitude meter as a function of the emitted radio-frequency signals;

determining a testing relationship between the predetermined amplitudes and the acquired testing amplitudes;

emitting a signal when the determined testing relationship deviates from a predetermined reference relationship.

17. The computer program product of claim 16, wherein the instructions further comprise deactivating the non-active detuning apparatus of the antenna coil, wherein the antenna coil is arranged in a region that, in the actuating, has a relevant field strength of the radio-frequency signals.

18. In a non-transitory computer-readable storage medium that stores instructions executable by a controller of a magnetic resonance tomography system to detect an antenna coil with a non-active detuning apparatus, with an apparatus comprising a transmitter, an antenna, a real time amplitude meter, and a controller, the instructions comprising:

actuating, by the controller, the transmitter, so that the transmitter emits radio-frequency signals with different predetermined amplitude via the antenna;

acquiring testing amplitudes with the real time amplitude meter as a function of the emitted radio-frequency signals;

determining a testing relationship between the predetermined amplitudes and the acquired testing amplitudes;

emitting a signal when the determined testing relationship deviates from a predetermined reference relationship.

19. The non-transitory computer-readable storage medium of claim 18, wherein the instructions further comprise deactivating the non-active detuning apparatus of the antenna coil, wherein the antenna coil is arranged in a region that, in the actuating, has a relevant field strength of the radio-frequency signals.

* * * * *